UNITY GAIN DIFFERENTIAL AMPLIFIER
Filed Nov. 28, 1967
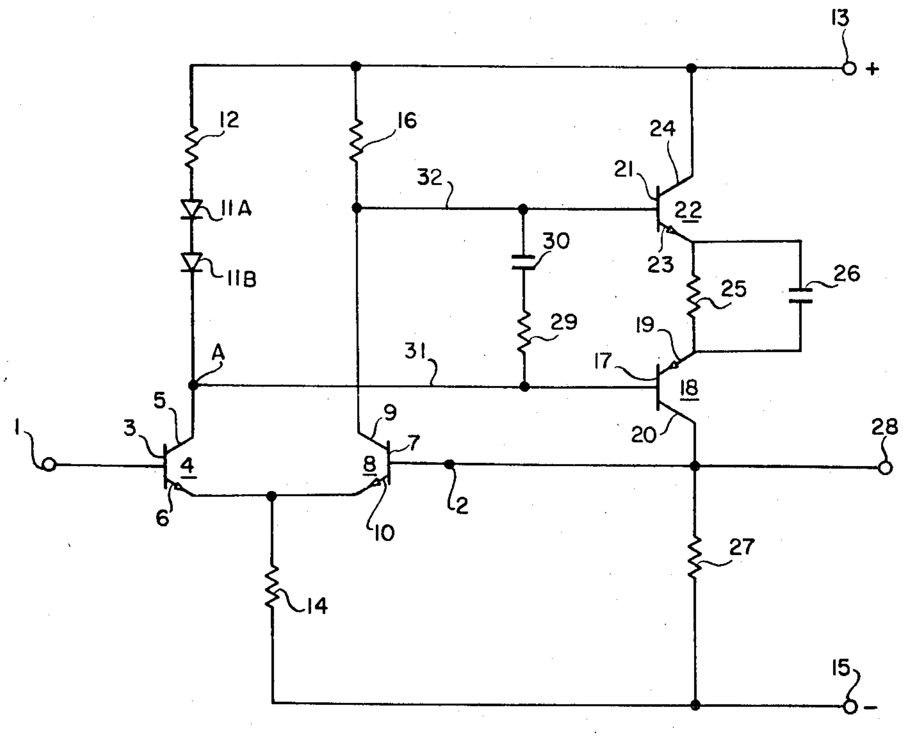
INVENTORS
TROY C. STARK
EGON F. DONNER
By George C. Sullivan
Agent

United States Patent Office 3,508,163
Patented Apr. 21, 1970

3,508,163

UNITY GAIN DIFFERENTIAL AMPLIFIER

Troy C. Stark, Campbell, and Egon F. Donner, San Jose, Calif., assignors to Lockheed Aircraft Corporation, Burbank, Calif.

Filed Nov. 28, 1967, Ser. No. 686,220
Int. Cl. H03f *3/68*
U.S. Cl. 330—30 5 Claims

ABSTRACT OF THE DISCLOSURE

A two-stage differential amplifier having unity gain is disclosed. The circuit used greatly reduces the common mode noise signal, has a low temperature coefficient, and is adaptable to monolithic integration because of the low value capacitors utilized and the relatively wide tolerance limits on the components.

BACKGROUND OF THE INVENTION

This invention relates to transistor amplifiers having high input impedance and broadband frequency response, and particularly to unity gain amplifier circuits which provide precision unity gain over a wide frequency band.

Two basic methods are normally utilized for producing unity gain amplification. One method is termed an indirect method and utilizes an even number of amplifiers connected in series, the sum of the amplifier gains being unity. Another method is termed a direct method and uses a differential amplifier which directly senses the voltage difference between the input signals and the output signals and thus provides information which can be utilized to cancel the common mode error. The amplifiers which use the direct method normally consist of two or more integrally connected symmetrical amplifiers. The present invention utilizes two amplifiers, the product of their gain being unity. The first stage operates as a differential amplifier in which the input is applied to one side and the feedback from the second stage is applied to the other side.

One problem of the heretofore available different amplifiers which has not been satisfactorily solved in the known art is the reduction or elimination of common mode noise signals. Common mode signals are caused by induction and radiation fields of nearby equipment, nearby conductors, and a multitude of other sources including galvanic and other electro-mechanical effects. These extraneous signals are commonly referred to as "static."

Prior art attempts to alleviate this difficulty have been directed towards utilizing input filters which effectively shorten to common any signal above a certain low-pass frequency. Such approaches, however, always necessitate a compromise on the upper frequency limit of the system. Furthermore, the shunt capacitance to common tends to destroy whatever other common mode rejection capability the amplifier has, particularly with unbalanced sources.

Another problem encountered by the prior art was drift in the amplifier due to change in temperature. The design of the circuits placed a tight tolerance restriction on the components which is interrelated to a high temperature coefficient.

SUMMARY OF THE INVENTION

The object of the present invention is the improvement of unity gain amplifiers, and in particular unity gain amplifiers having a high input impedance, broadhand frequency response, and a low temperature coefficient.

It is still a further object of the invention to provide an improved transistorized differential amplifier that will have stringent drift specifications, broadband frequency response, not requiring close tolerances of its components, and adaptable to monolithic integration.

BRIEF DESCRIPTION OF THE DRAWING

Other objects and advantages of this invention will be readily appreciated and the same can be better understood by reference to the following detailed description when considered in connection with the accompanying drawing, wherein:

The single figure is a schematic diagram of an example of a differential amplifier constructed in accordance with the principles of the present invention.

Referring to the figure, there is shown a differential amplifier having a pair of input terminals, 1 and 2. Input terminal 1 is directly connected to the base 3 of a current control device, in this case a transistor 4. Transistor 4 further has a collector 5 and an emitter 6. Input terminal 2 is directly connected to base 7 of transistor 8, or similar current control device. Transistor 8 further has a collector 9 and emitter 10.

Collector 5 of transistor 4 is connected to diodes 11*a* and 11*b* which are shown as a pair of series connected diodes but could be a single diode having the desired short receiving time and extremely high back resistance. The other end of diode 11*a* is connected to resistor 12 which in turn is connected to the positive potential source 13.

Emitter 6 of transistor 4 is connected directly to emitter 10 of transistor 8. Emitters 6 and 10 are further connected by means of resistor 14 to a negative source of energizing potential 15. Collector 9 of transistor 8 is connected by means of resistor 16 to a positive source energizing potential 13. Transistors 4 and 8 and their associated circuitry comprise a first difference amplifier.

Collector 5 of transistor 4 is connected by means of a conductor 31 to a base 17 of transistor 18, or similar current control device. Transistor 18 further has an emitter 19 and a collector 20. Collector 9 of transistor 8 is connected by means of a conductor 32 to a base 21 of a transistor 22, or similar current control device. Transistor 22 further has an emitter 23 and a collector 24. Emitter 23 of transistor 22 is connected by means of a resistor 25 and a parallel capacitor 6 to emitter 19 of transistor 18. Collector 24 of transistor 22 is further connected to a positive potential source 13. Collector 20 of transistor 18 is connected by means of resistor 27 to the negative source of energizing potential 15. Transistors 18 and 22 and their associated circuitry comprise a second difference amplifier.

Collector 20 of transistor 18 is further connected to the input terminal 2 and an output terminal 28.

A resistor 29 and a series capacitor 30 connect conductor 31 to conductor 32.

OPERATION

Steady state operation, i.e., when the input and the output both are grounded, the result is as follows: There are three loop currents within the system, the first goes from the positive source 13 and is divided equally between resistor 12, diodes 11*a*, 11*b*, transistor 4 in one path and resistor 16 and transistor 8 in the other path and thence to resistor 14 to minus terminal 15. The second loop current goes from positive potential source 13 through transistor 22, resistor 25, transistor 18, resistor 27 into negative terminal 15. The third loop current goes from the base through the emitter of transistor 22, to resistor 25 through the emitter and then the base of transistor 18, then through diodes 11*a*, 11*b*, resistor 12 and resistor 16 back to the base of transistor 22. Obviously the third current is less than the first current for if it were otherwise diodes 11*a* and 11*b* would be non-conducting.

When a positive going signal is applied to input terminal 1, the result is as follows:

Transistor 4 is more conductive, causing an increase in the current from positive terminal 13 through resistor 12, diodes 11*a*, 11*b*, and resistor 14 to negative terminal 15. This causes a drop in the potential at point A, which in turn increases the forward bias on transistors 22 and 18. This increase of forward bias increases the conduction of current through transistors 22 and 18, thus raising the potential of output terminal 28 and point 2. This increase of potential increases the conduction of transistor 8, thus decreasing the above-mentioned quiescent first circulating current through the diodes 11*a*, 11*b*, resistor 12, resistor 14, transistor 22, resistor 25 and transistor 18. This reduces the potential on the base 21 of transistor 22 which tends to decrease the conduction of transistor 22. This decrease in conduction decreases the current through resistor 25 thus raising the potential at terminal 19 of transistor 18. This, in turn, helps decrease the conduction of transistor 18 thereby bringing output terminal 28 into the same higher potential as input terminal 1.

The particular type of components and values of components of the above described circuit is specified for the purpose of presenting a specific embodiment. The sizes and types of impedance also could be varied without departing from the scope of the invention. Although transistors have been described as the active components of the circuit, any other non-linear impedance having control electrode means to control the value of the non-linear impedance could be used. These and other modifications could be made on the circuit of the present invention without departing from the spirit and scope of the invention which is to be limited only as defined in the appended claims.

We claim:

1. A unity gain differential amplifier in which the output signal has the same polarity and magnitude as the input signal comprising:
- first and second amplifiers,
- said first amplifier includes a first and second current control means, each having a collector electrode, an emitter electrode, and a control electrode,
- said second amplifier includes a third and fourth current control means each having an emitter electrode, a collector electrode, and a control electrode,
- first means adapted to connect said control electrode of said first current control means to a source of input signals,
- said collector electrode of said third current control means connected to the said control electrode of said second current control means,
- said collector electrode of said first current control means connected to the said control electrode of said third current control means,
- second means connected between the said collector electrode of said first current control means to the collector electrode of said fourth current control means,

- said collector electrode of said second current control means connected by a third means to the control electrode of said fourth current control means,
- means including a first resistance means further connecting the said collector electrode of said second current control means to the collector electrode of said furth current control means,
- said second means also connected between the collector electrode of said fourth current control means and a source of positive potential,
- fourth means connecting the emitter electrode of said fourth current control means to the emitter electrode of said third current control means,
- said emitter electrode of said first current control means further connected to the emitter electrode of said second current control means,
- second resistance means connecting said emitter electrode of said first current control means and said emitter electrode of said second current control means to a source of negative potential,
- third resistance means adapted to connect the collector electrode of said third current control device to a source of negative potential,
- fifth means adapted to further connect the collector electrode of said third current control device to an output means.

2. The unity gain differential amplifier according to claim 1 wherein:
- said second means is further defined as including a resistance means and at least one unidirectional means.

3. The unity gain differential amplifier according to claim 2 wherein:
- said third means is further defined as including a first capacitance means and a fourth resistance means.

4. The unity gain differential amplifier according to claim 3 wherein:
- said fourth means is further defined as including a second capacitance means and a fifth resistance means.

5. Apparatus according to claim 4 wherein:
- said first capacitance means and said fourth resistance means are connected in series relationship, and
- said second capacitance means and said fifth resistance means are connected in parallel relationship.

References Cited

UNITED STATES PATENTS

| | | | |
|---|---|---|---|
| 3,168,708 | 2/1965 | Stuart-Williams et al. | 330—30 X |
| 3,213,385 | 10/1965 | Sikorra | 330—30 X |
| 3,292,098 | 12/1966 | Bensing | 330—30 X |
| 3,378,280 | 4/1968 | Lin | 330—24 |

NATHAN KAUFMAN, Primary Examiner

U.S. Cl. X.R.

330—28